US012745659B2

(12) United States Patent
Oh et al.

(10) Patent No.: US 12,745,659 B2
(45) Date of Patent: Sep. 22, 2026

(54) SEMICONDUCTOR PACKAGE INCLUDING SEMICONDUCTOR CHIP HAVING THROUGH-ELECTRODE

(71) Applicant: Samsung Electronics Co., Ltd., Suwon-si (KR)

(72) Inventors: Seungryong Oh, Suwon-si (KR); Chajea Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 18/380,042

(22) Filed: Oct. 13, 2023

(65) Prior Publication Data

US 2024/0194575 A1 Jun. 13, 2024

(30) Foreign Application Priority Data

Dec. 8, 2022 (KR) ........................ 10-2022-0170806

(51) Int. Cl.

*H10W 70/685* (2026.01)
*H10W 90/00* (2026.01)
*H10W 74/00* (2026.01)

(52) U.S. Cl.

CPC ......... *H10W 70/685* (2026.01); *H10W 90/00* (2026.01); *H10W 90/701* (2026.01); (Continued)

(58) Field of Classification Search

CPC ......... H01L 23/49822; H01L 23/49816; H01L 24/08; H10W 70/685; H10W 90/00; H10W 90/701; H10W 74/00; H10W 90/722; H10W 90/792; H10W 90/794; H10W 90/291; H10W 90/297; H10W 72/90;

(Continued)

(56) References Cited

U.S. PATENT DOCUMENTS 9,899,337 B2 2/2018 Chang et al.
10,784,247 B2 9/2020 Chen et al.
(Continued)

FOREIGN PATENT DOCUMENTS

CN 114446901 A 5/2022

*Primary Examiner* — Ratisha Mehta
(74) *Attorney, Agent, or Firm* — Muir Patent Law, PLLC

(57) ABSTRACT

A semiconductor package includes a first semiconductor chip including a first bonding layer, the first bonding layer including a first chip pad and a first insulating layer covering a side surface of the first chip pad, a second semiconductor chip disposed below the first semiconductor chip and including a substrate having front and rear surfaces, the front surface forming a second bonding layer, and through-electrodes passing through the substrate and having protrusions protruding from the rear surface, the second bonding layer including a second chip pad contacting the first chip pad and a second insulating layer covering a side surface of the second chip pad, a redistribution layer disposed below the second semiconductor chip and electrically connected to the second semiconductor chip, vias disposed between the redistribution layer and the first semiconductor chip and disposed around the second semiconductor chip, and an encapsulant surrounding the second semiconductor chip, the redistribution layer, and the vias. The encapsulant may be in contact with the protrusions of the through-electrodes.

20 Claims, 11 Drawing Sheets

(52) U.S. Cl.
CPC .......... *H10W 74/00* (2026.01); *H10W 90/722* (2026.01); *H10W 90/792* (2026.01); *H10W 90/794* (2026.01)

(58) Field of Classification Search
CPC ..... H10W 72/20; H10W 99/00; H10W 70/60; H10W 70/65
See application file for complete search history.

(56) References Cited

U.S. PATENT DOCUMENTS

| | | | | |
|---|---|---|---|---|
| 10,985,760 | B2 * | 4/2021 | Lee | H01L 24/92 |
| 2012/0193785 | A1 * | 8/2012 | Lin | H01L 24/97<br>257/737 |
| 2020/0168527 | A1 | 5/2020 | Chang et al. | |
| 2020/0381398 | A1 | 12/2020 | Lan et al. | |
| 2020/0388563 | A1 | 12/2020 | Yu et al. | |
| 2021/0013181 | A1 * | 1/2021 | Han | H01L 24/13 |
| 2021/0098380 | A1 | 4/2021 | Chen et al. | |
| 2021/0358875 | A1 * | 11/2021 | Lee | H01L 24/94 |
| 2022/0028791 | A1 | 1/2022 | Choi | |
| 2022/0077123 | A1 | 3/2022 | Zhang et al. | |
| 2024/0055326 | A1 * | 2/2024 | Shigetoshi | H01L 24/05 |

* cited by examiner

'A'

10B
100
200
110
120
130
210
220
230
240
320
131
132
235
231
232
S1
AS2
321
322
Z
Y
X
330
236
412
411
400
420
240a
S2

SEMICONDUCTOR PACKAGE INCLUDING SEMICONDUCTOR CHIP HAVING THROUGH-ELECTRODE

CROSS-REFERENCE TO RELATED APPLICATION(S)

This application claims benefit of priority to Korean Patent Application No. 10-2022-0170806 filed on Dec. 8, 2022, in the Korean Intellectual Property Office, the disclosure of which is incorporated herein by reference in its entirety.

BACKGROUND

The present inventive concept relates to semiconductor packages and methods of manufacturing the same, and more particularly to semiconductor packages including a semiconductor chip having a through-electrode, and methods of manufacturing the same.

As demand for high performance, high speed, and/or multifunctionality of semiconductor devices has increased, the degree of integration of semiconductor devices has increased. The high integration of semiconductor devices may require manufacturing processes for the semiconductor devices to use fine patterns having a fine width or a fine separation distance. In addition, higher integration of semiconductor devices may require multiple semiconductor devices to be mounted in a semiconductor package.

SUMMARY

An aspect of the present inventive concept is to provide a semiconductor package including an encapsulant covering a through-electrode of a semiconductor chip.

According to an aspect of the present inventive concept, a semiconductor package includes: a first semiconductor chip including a first bonding layer, the first bonding layer including a first chip pad and a first insulating layer covering a side surface of the first chip pad; a second semiconductor chip disposed below the first semiconductor chip and including a substrate having front and rear surfaces, a second bonding layer disposed on the front surface, and through-electrodes passing through the substrate and having protrusions protruding from the rear surface, the second bonding layer including a second chip pad contacting the first chip pad and a second insulating layer covering a side surface of the second chip pad; a redistribution layer disposed below the second semiconductor chip and electrically connected to the second semiconductor chip; vias disposed between the redistribution layer and the first semiconductor chip and disposed around the second semiconductor chip; and an encapsulant covering the second semiconductor chip, the redistribution layer, and the vias. The encapsulant may be in contact with the protrusions of the through-electrodes.

According to another aspect of the present inventive concept, a semiconductor package includes: a first semiconductor chip including a first active surface; a second semiconductor chip including a second active surface in contact with the first active surface, the second semiconductor chip including a substrate including front and rear surfaces and through-electrodes passing through the substrate and protruding from the rear surface of the substrate; a redistribution layer disposed below the second semiconductor chip and electrically connected to the second semiconductor chip; vias disposed between the redistribution layer and the first semiconductor chip and disposed around the second semiconductor chip; and an encapsulant covering the second semiconductor chip, the redistribution layer, and the vias. The encapsulant may be in contact with the protrusions of the through-electrodes.

According to another aspect of the present inventive concept, a semiconductor package includes: a first semiconductor chip including a first bonding layer; a second semiconductor chip disposed below the first semiconductor chip and including a substrate having front and rear surfaces, a second bonding layer disposed on the front surface, and through-electrodes passing through the substrate and protruding from the rear surface; chip connection terminals disposed on the first semiconductor chip and connecting the first semiconductor chip to the second semiconductor chip; a redistribution layer disposed below the second semiconductor chip and electrically connected to the second semiconductor chip; vias disposed between the redistribution layer and the first semiconductor chip and disposed around the second semiconductor chip; and an encapsulant covering the second semiconductor chip, the redistribution layer, and the vias. The encapsulant may be in contact with the protrusions of the through-electrodes.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, illustrative embodiments of the present inventive concept will be described with reference to the accompanying drawings.

Figure 1A:
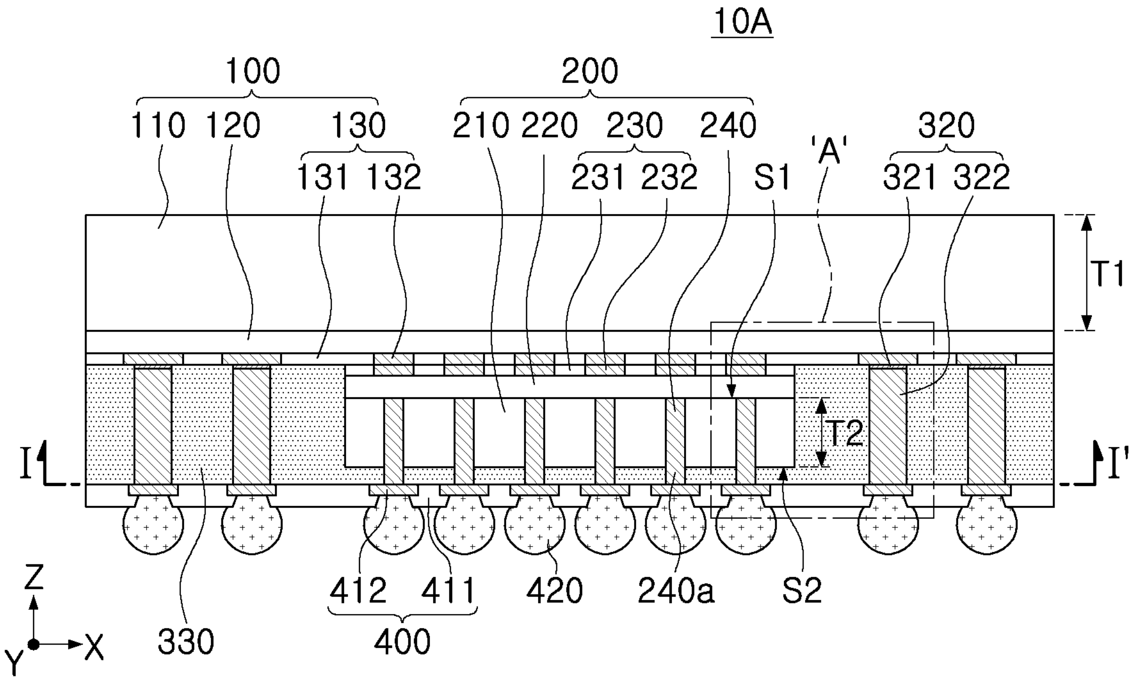
FIG. 1A is a cross-sectional view of a semiconductor package according to some embodiments.
Figure 1B:
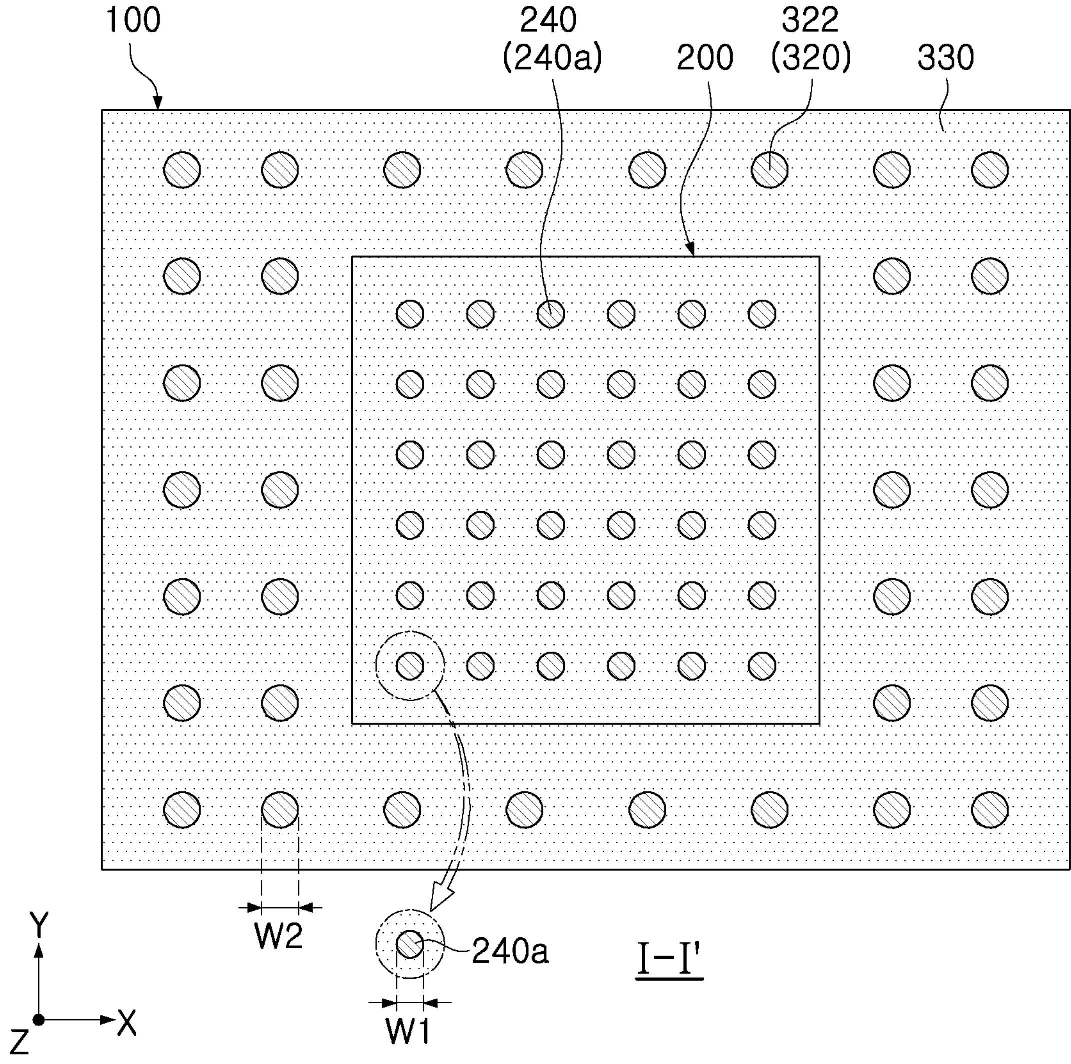
FIG. 1B is a plan view of the semiconductor package illustrated in FIG. 1A.
Figure 1C:
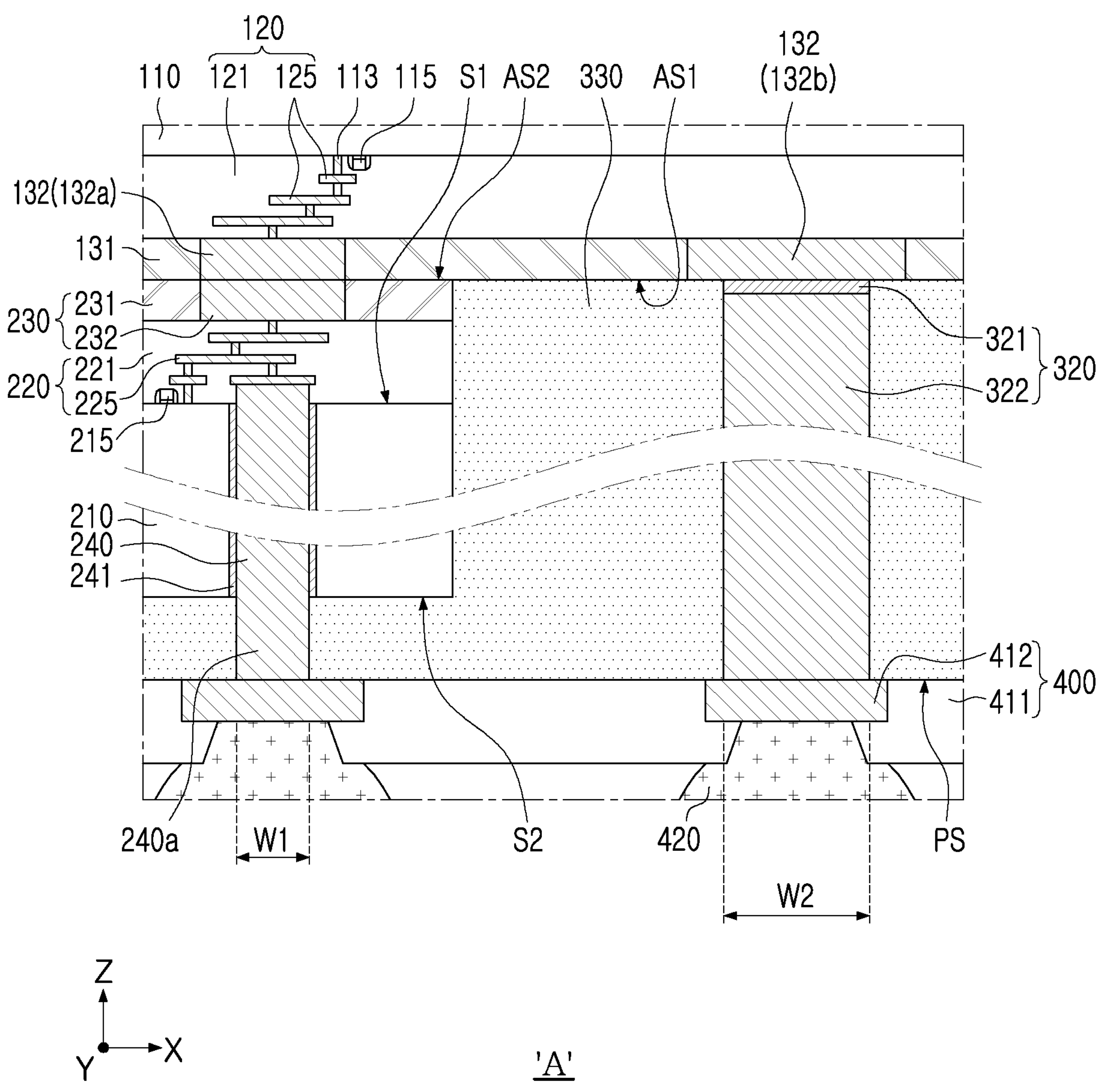
FIG. 1C is a partially enlarged view of the semiconductor package illustrated in FIG. 1A.

FIG. 1A is a cross-sectional view of a semiconductor package 10A according to an embodiment of the present inventive concept, FIG. 1B is a plan view taken along line I-I' of FIG. 1A, and FIG. 1C is a partially enlarged view illustrating region ‘A’ of FIG. 1A.

Referring to FIGS. 1A to 1C, the semiconductor package 10A according to an embodiment may include a first semiconductor chip 100, a second semiconductor chip 200, and an encapsulant 330. According to embodiments, the semiconductor package 10A may further include through-vias 320, a redistribution layer 400, and/or an external connection terminal 420.

According to some embodiments of the present inventive concept, a signal transmission path between the first semiconductor chip 100 and the second semiconductor chip 200 may be minimized by bonding an active surface AS1 of the first semiconductor chip 100 and an active surface AS2 of the second semiconductor chip 200 to each other as depicted in FIG. 1C. Bonding the active surface AS1 of the first semiconductor chip 100 and the active surface AS2 of the second semiconductor chip 20 to each other may minimize the distance between the active surface areas AS1, AS2 thereby minimizing the active signal transmission path. The first semiconductor chip 100 and the second semiconductor chip 200 may be a logic chip including a central processing unit (CPU), a graphics processing unit (GPU), a field programmable gate array (FPGA), a digital signal processor (DSP), a cryptographic processor, a microprocessor, a microcontroller, an analog-to-digital converter (ADC), and the like, or a memory chip including a volatile memory (e.g., DRAM), a non-volatile memory (e.g., ROM and flash memory), and the like. For example, the first semiconductor chip 100 may include a logic circuit, such as an application specific integrated circuit (ASIC), and the second semiconductor chip 200 may include a cache memory circuit providing cache information to the first semiconductor chip 100. In some embodiments, the size of the second semiconductor chip 200 may be smaller than that of the first semiconductor chip 100. For example, a horizontal width of the first semiconductor chip 100 may be greater than a horizontal width of the second semiconductor chip 200, and the second semiconductor chip 200 may have a planar area substantially equal to or smaller than that of the first semiconductor chip 100.

In addition, the first semiconductor chip 100 and the second semiconductor chip 200 may be directly bonded to one another and combined without a separate intervening connection member (e.g., adhered to each other without requiring a solder bump, a copper post, adhesive, etc.). Such a configuration, i.e., one having semiconductor chips directly bonded to one another, may be referred to as hybrid bonding, or direct bonding. Hybrid bonding may include metal bonding by pads of the semiconductor chips bonded to each other and/or dielectric bonding of insulating layers of the semiconductor chips bonded to each other. Thus, the first and second semiconductor chips may be in contact with one another, and materials of the first and second semiconductor chips (e.g., pads and/or insulating layers) may merge with (e.g., diffuse into) one another to establish a direct bond between the first and second semiconductor chips to directly connect the first and semiconductor chips. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. It should be appreciated that direct bonding of the first and second semiconductor chips avoids additional separation of the first and second semiconductor chips by of an additional connection member, however, additional connections of the first and second semiconductor chips may also be applied in certain designs (e.g., such as use of an encapsulate, such as encapsulant 330 or an additional encapsulant surrounding the first and second semiconductor chips).

In addition, by encapsulating a portion of the first semiconductor chip 100 and a portion of the second semiconductor chip 200 using the encapsulant 330, which may be comprised of an insulating resin, a difficulty of a planarization process may be lowered and the yield may be improved. The "planarization process" may include a series of processes of forming a flat surface including the lowermost surface of the through-electrodes 240, the lowermost surfaces of the through-vias 320, and the lowermost surface of the encapsulant 330. For example, a grinding process, a polishing process, and the like may be used as the "planarization process." After the planarization process, the lowermost surface of the through-electrodes 240, the lowermost surface of the through-vias 320, and the lowermost surface of the encapsulant 330 may be substantially coplanar (e.g., 'PS' in FIG. 1C).

Hereinafter, embodiments of semiconductor packages and their respective components will be described in further detail with reference to FIGS. 1 through 5.

With reference to FIGS. 1A through 1C, in some embodiments the first semiconductor chip 100 may include a first substrate 110, a first circuit layer 120, and a first bonding layer 130, and the first bonding layer 130 may include a first insulating layer 131 and first pads 132. For example, the first semiconductor chip 100 may have a flat lower surface formed by the first insulating layer 131 and the first pads 132. The lower surfaces of the first insulating layer 131 and the first pads 132 may be coplanar. The first pads 132 may be chip pads of the first semiconductor chip 100 and constitute signal and power terminals of the first semiconductor chip 100 for its internal circuits formed therein.

The first substrate 110 may be a portion of a semiconductor wafer, formed of and/or include a crystalline semiconductor material, such as being an elemental semiconductor, such as silicon or germanium, or a compound semiconductor, such as silicon carbide (SiC), gallium arsenide (GaAs), indium arsenide (InAs), and indium phosphide (InP). The first substrate 110 may have an active surface (e.g., a surface facing the first circuit layer 120) having an active region doped with impurities and an inactive surface opposite thereto.

The first circuit layer 120 may be disposed on a lower surface of the first substrate 110 and may include an interlayer insulating layer 121 and wiring 125. Wiring 125 comprises the interconnected conductive material of the first circuit layer and surrounded by the interlayer insulating layer 121. The interlayer insulating layer 121 may comprise several component insulating layers each of which may be formed of and/or include flowable oxide (FOX), tonen silazane (TOSZ), undoped silica glass (USG), borosilicate glass (BSG), phosphosilicate glass (PSG), borophosphosilicate glass (BPSG), plasma enhanced tetra ethyl ortho silicate (PETEOS), fluorosilicate glass (FSG), high density plasma (HDP) oxide, plasma enhanced oxide (PEOX), flowable CVD (FCVD) oxide, or combinations thereof. At least a portion of the interlayer insulating layer 121 surrounding the wiring 125 may be formed of and/or include a low dielectric layer formed of and/or include a material having a low dielectric constant relative to that of silicon dioxide. The interlayer insulating layer 121 may be formed using a chemical vapor deposition (CVD) process, a flowable-CVD process, or a spin coating process.

Wiring 125 may be formed as a multilayer structure including several wiring pattern component layers, each having one or more wiring patterns formed therein, and at least one via connecting the wiring patterns of the multilayer structure to form a plurality of discrete conductors (wires) to provide electrical paths for signal and/or power transfer. The wiring patterns and the at least one via may be formed of and/or include, for example, aluminum (Al), gold (Au), cobalt (Co), copper (Cu), nickel (Ni), lead (Pb), tantalum (Ta), tellurium (Te), titanium (Ti), tungsten (W), or combinations thereof. A barrier film (not shown) including titanium (Ti), titanium nitride (TiN), tantalum (Ta), or tantalum nitride (TaN) may be disposed between the wiring pattern or/and via and the interlayer insulating layer 121. Individual devices 115 constituting an integrated circuit may be disposed on and/or within a lower surface (or an active surface) of the first substrate 110. In this case, the wiring 125 may be electrically connected to the individual devices 115 through an interconnection portion 113 (e.g., a contact plug). The individual devices 115 may include FETs formed with the active surface of the first substrate 110, such as planar FETs and FinFETs, memory devices such as flash memories, DRAM, SRAM, EEPROM, PRAM, MRAM, FeRAM, and RRAM, logic circuits, such as AND, NAND, OR, NOR and NOT logic circuits formed of interconnected FETs, and various active and/or passive devices, such as elements of system LSI (system large scale integration) devices, CIS (CMOS image sensor) devices, and/or MEMS (micro-electromechanical systems). In some examples, some of the discrete conductors (wires) of the wiring 125 may electrically connect second chip pads 232 of the second semiconductor chip 200 to terminals of the semiconductor package 10A (e.g., external connection terminals 420) and/or not connect to individual devices 115 of the first semiconductor chip 100.

The first insulating layer 131 may be disposed below the first circuit layer 120 and surround the first pads 132. The first insulating layer 131 may contact side surfaces of the first pads 132 and may not be formed on the lower surfaces (the externally facing surfaces) of the first pads 132. The first insulating layer 131 may be formed of a material that can be bonded and combined with (merged with) the second insulating layer 231 of the second semiconductor chip 200. For example, the first insulating layer may be formed of and/or include at least one of silicon oxide (SiO), silicon nitride (SiN), or silicon carbonitride (SiCN). That is, at least a portion of the first insulating layer 131 may be bonded to the second insulating layer 231 by merging surface portions of the same to form a bonding surface between the first semiconductor chip 100 and the second semiconductor chip 200.

The first pads 132 may be connection terminals electrically connected to the wiring 125 of the first circuit layer 120. At least some of the first pads 132 may be dummy pads insulated from the wiring 125. The first pads 132 may include a first group of first pads 132*a* and a second group of first pads 132*b* disposed on a lower surface of the first semiconductor chip 100. The first group of first pads 132*a* may be connected to second pads 232 of the second semiconductor chip 200. The second group of first pads 132*b* may be connected to the through-vias 320. The first group of first pads 132*a* may be disposed to overlap the second semiconductor chip 200 in a direction (a Z-axis direction), perpendicular to a lower surface of the first semiconductor chip 100. The second group of first pads 132*b* may be disposed not to overlap the second semiconductor chip 200 in a vertical direction (the Z-axis direction). The first pads 132 may be formed of and/or include any one of copper (Cu), nickel (Ni), titanium (Ti), aluminum (Al), gold (Au), and silver (Ag), or alloys thereof. Together with the first insulating layer 131, the first pads 132 may form a bonding surface of the first semiconductor chip 100 to bond the first semiconductor chip 100 and the second semiconductor chip 200 together. A barrier film formed of and/or including at least one of titanium (Ti), titanium nitride (TIN), tantalum (Ta), or tantalum nitride (TaN) may be formed between the first insulating layer 131 and the first pads 132.

The second semiconductor chip 200 may be disposed below the first semiconductor chip 100 and may be disposed in a central portion of the first semiconductor chip 100 as viewed in a plan view. The second semiconductor chip 200 may include a second substrate 210 having a front surface S1 and a rear surface S2 opposing each other, a second circuit layer 220, a second bonding layer 230, and through-electrodes 240. The second bonding layer 230 may include a second insulating layer 231 and second pads 232. The second semiconductor chip 200 may be provided by the second insulating layer 231 and the second pads 232 and may have a flat upper surface in contact with the lower surface of the first semiconductor chip 100. According to some embodiments, the number of second semiconductor chips 200 may be smaller or larger than those illustrated in the drawings. For example, the second semiconductor chip 200 may be provided as two or more semiconductor chips horizontally disposed below the first semiconductor chip 100. Also, according to embodiments, the second semiconductor chip 200 may be provided as a plurality of semiconductor chips stacked below the first semiconductor chip 100 in a vertical direction (the Z-axis direction). The second semiconductor chip 200 may be thinner than the first semiconductor chip 100. For example, a thickness T1 of the first substrate 110 of the first semiconductor chip 100 may be about 40 μm to about 600 μm, and a thickness T2 of the second substrate 221 of the second semiconductor chip 200 may be about 10 μm to about 40 μm.

Since the second semiconductor chip 200 may have substantially the same or similar structure as the first semiconductor chip 100, the same or similar components are denoted by the same or similar reference numerals, and hereinafter, redundant descriptions of the same elements may be omitted. For example, since the second substrate 210 and the second circuit layer 220 have the same or similar characteristics as those of the first substrate 110 and the first circuit layer 120 described above further description of second substrate 210 and the second circuit layer 220 is omitted. Similarly, components corresponding to each other are denoted with similar reference numerals and redundant descriptions may be omitted.

The second insulating layer 231 may be disposed on the second circuit layer 220 and surround the second pads 232. The second insulating layer 231 may contact side surfaces of the second pads 232 and may not be formed on the upper surfaces (the externally facing surfaces) of the second pads 232. The upper surfaces of the second insulating layer 231 and the second pads 232 may be coplanar. The second insulating layer 231 may be formed of a material that can be bonded and combined with (merged with) the first insulating layer 131. For example, the second insulating layer 231 may be formed of and/or include at least one of silicon oxide (SiO), silicon nitride (SiN), or silicon carbonitride (SiCN).

The second pads 232 may be connection terminals disposed on the front surface S1 of the second substrate 210 and electrically connected to the wiring structure 225 of the second circuit layer 220. The second pads 232 may be chip pads of the second semiconductor chip 200 and constitute signal and power terminals of the first semiconductor chip 200 for its internal circuits formed therein. The second pads 232 may form a bonding surface between the first semiconductor chip 100 and the second semiconductor chip 200 together with the second insulating layer 231. The second pads 232 may be formed of copper (Cu), nickel (Ni), titanium (Ti), aluminum (Al), gold (Au), and silver (Ag), or alloys thereof. For example, the second pads 232 may be bonded and combined with the first pads 132.

The through-electrodes 240 may be electrically connected to the wiring structure 225 and the second pads 232 of the second circuit layer 220. The through-electrodes 240 may pass through the second substrate 210 and protrude from the rear surface S2 of the second substrate 210. For example, the through-electrode 240 may have a protrusion 240*a* protruding downwardly from the rear surface S2 of the second substrate 210. The through-electrodes 240 may be connected to a redistribution layer 400 through the protrusion 240*a*.

The through-electrodes 240 may include a via plug and a side barrier film (not shown) surrounding a side surface of the via plug. The via plug may be formed of and/or include, for example, tungsten (W), titanium (Ti), aluminum (Al), or copper (Cu), and may be formed through a plating process, a PVD process, or a CVD process. The side barrier film may be formed of and/or include titanium (Ti), titanium nitride (TiN), tantalum (Ta), or tantalum nitride (TaN), and may be formed through a plating process, a PVD process, or a CVD process. A side insulating layer 241 including an insulating material (e.g., high aspect ratio process (HARP) oxide), such as silicon oxide, silicon nitride, or silicon oxynitride may be formed between the through-electrodes 240 and the second substrate 210.

The through-vias 320 may be disposed around the second semiconductor chip 200 and may contact the first pads 132. For example, in a plan view, the through-vias 320 may be disposed to surround the second semiconductor chip 200. For example, in a plan view, the through-vias 320 may be regularly arranged along a shape (e.g., a square or rectangle) enclosing second semiconductor chip 200. At least some of the through-vias 320 may be electrically connected to the wiring 125 of the first circuit layer 120. According to embodiments, at least some of the through-vias 320 may be dummy vias that are electrically insulated from the wiring 125 and the individual devices 115. Each of the dummy vias may form a portion of an open circuit that does not connect to any of the individual devices 115 (or any other active or passive device). Each of the through-vias 320 may include a seed layer 321 on a first chip pad 132 extending between an inner wall of an opening in the encapsulate 330 exposing the corresponding first chip pad 132 and a plating layer 322 extending below the seed layer 321. The seed layer 321 may be formed of and/or include copper (Cu), titanium (Ti), a copper (Cu) alloy, or a titanium (Ti) alloy, and the plating layer 322 may be formed of and/or include copper (Cu) or a copper (Cu) alloy. The through-electrodes 240 may have a width W1 smaller than a width W2 of the through-vias 320. For example, the width W1 of the through-electrodes 240 may be about 1 μm to about 5 μm, and the width W2 of the through-vias 320 may be about 4 μm to about 100 μm.

The encapsulant 330 may cover at least a portion of each of the first semiconductor chip 100 and the second semiconductor chip 200. For example, the encapsulant 330 may contact the first active surface AS1 of the first semiconductor chip 100, and may contact a side surface and the rear surface S2 of the second semiconductor chip 200. The encapsulant 330 may fill gaps between the protrusions 240*a* of the through-electrodes 240. In some embodiments, the encapsulant 330 may be formed of and/or include a polymer material having good gap-filling capability, and the polymer material may be thermocurable, photocurable, or both thermocurable and photocurable. In some embodiments, the encapsulant 330 may be formed of and/or include an insulating resin, for example, a thermosetting resin, such as epoxy resin, a thermoplastic resin, such as polyimide, or a material in which these resins are impregnated in an inorganic filler or/and glass fiber (glass cloth or glass fabric), etc., for example, prepreg, ABF (Ajinomoto Build-up Film), FR-4, bismaleimide triazine (BT), epoxy molding compound (EMC), and the like.

The redistribution layer 400 may be disposed below the encapsulant 330 and may include a protective layer 411 and a wiring layer 412. The redistribution layer 400 may be electrically connected to the through-electrode 240 and the through-via 320. For example, each of the through-electrode 240 and the through-via 320 may contact at least one of the wiring layers 412. The wiring layer 412 may include, for example, a ground pattern, a power pattern, and a signal pattern. The signal pattern may transmit a data signal transferred from the first semiconductor chip 100 and the second semiconductor chip 200 to the outside or transmit a data signal transferred from the outside to the first semiconductor chip 100 and the second semiconductor chip 200. According to some embodiments, at least a portion of the power pattern and/or the ground pattern may be connected to the first semiconductor chip 100 through the through-via 320. The wiring layer 412 may be formed of and/or include several component wiring layers interconnected by vias, formed with several component insulating layers (e.g., similar to the structure described with respect to wiring 125).

The protective layer 411 may cover a lower surface of the encapsulant 330 and a side surface of the wiring layer 412. The protective layer 411 may protect the wiring layer 412 from external physical/chemical damage. The protective layer 411 may be formed using prepreg, ABF, FR-4, BT, photo-imageable dielectric (PID), photo solder resist, or the like. The wiring layer 412 may be formed of and/or include aluminum (Al), gold (Au), cobalt (Co), copper (Cu), nickel (Ni), lead (Pb), tantalum (Ta), tellurium (Te), titanium (Ti), tungsten (W), or combinations thereof.

The external connection terminal 420 may be disposed below the redistribution layer 400 and may be connected to the wiring layer 412. After forming the protective layer 411 to cover the wiring layer 412, openings may be formed in the protective layer 411 to expose portions of the wiring layer 412 on which external connection terminals 420 may be formed. The external connection terminal 420 may be formed of and/or include at least one of copper (Cu), nickel (Ni), tin (Sn), or an alloy (Sn—Ag) including tin. For example, the external connection terminal 420 may include a pillar portion connected to the wiring layer 412 and a solder portion below the pillar portion. The pillar portion may be formed of and/or include at least one of copper (Cu) or nickel (Ni), and the solder portion may be formed of and/or include an alloy (Sn—Ag) including tin. The semiconductor package 10A may be connected to an external device, such as a module substrate or a system board, through the external connection terminal 420.

Figures 2A, 2B:
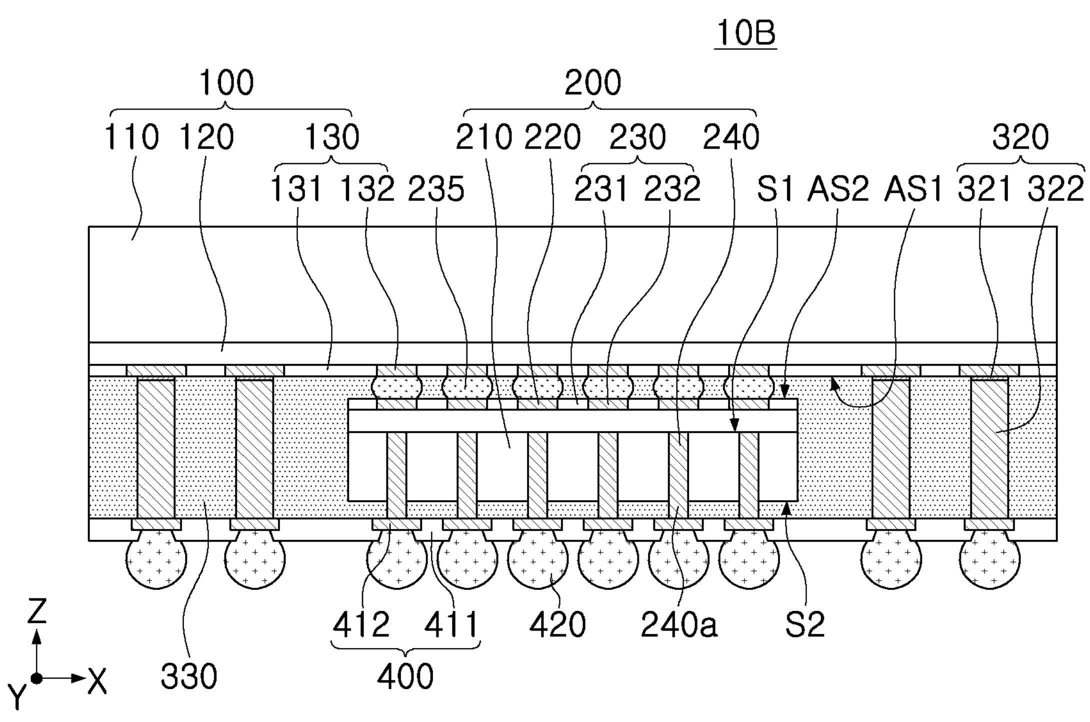
FIG. 2A is a cross-sectional view of a semiconductor package according to an embodiment.
FIG. 2B is a cross-sectional view of a semiconductor package according to an embodiment.

FIG. 2A is a cross-sectional views of a semiconductor package according to an embodiment.

Referring to FIG. 2A, a semiconductor package 10B according to an embodiment may further include a chip connection terminal 235 connecting the first semiconductor chip 100 and the second semiconductor chip 200 to each other. For example, the chip connection terminal 235 may be disposed between the first bonding layer 130 of the first semiconductor chip 100 and the second bonding layer 230 of the second semiconductor chip 200, and may be connected to the first pad 132 and the second pad 232. When the first semiconductor chip 100 and the second semiconductor chip 200 are stacked by a temperature-compression bonding (TCB) method, the chip connection terminal 235 may be used to bond the first pad 132 and the second pad 232. The first active surface AS1 of the first semiconductor chip 100 and the second active surface AS2 of the second semiconductor chip 200 may be spaced apart from each other without contacting each other. Since the encapsulant 330 of some embodiments includes a thermosetting and/or photo-curable polymer material and has good gap-filling capability, the encapsulant 330 may fill a space between the first bonding layer 130 and the second bonding layer 230 and between the chip connection terminals 235. For example, the encapsulant 330 may contact the first bonding layer 130, the second bonding layer 230, and the chip connection terminals 235.

FIG. 2B is a cross-sectional view of a semiconductor package according to an embodiment.

Referring to FIG. 2B, the semiconductor package according to an embodiment may further include an adhesive layer 236 covering the chip connection terminals 235. For example, the adhesive layer 236 may be disposed to cover the chip connection terminals 235 between the first bonding layer 130 and the second bonding layer 230. The adhesive layer 236 may be, for example, a non-conductive film (NCF). The second active surface AS2 of the second semiconductor chip 200 may be covered by the adhesive layer 236 and may not be in contact with the encapsulant 330.

Figure 3:
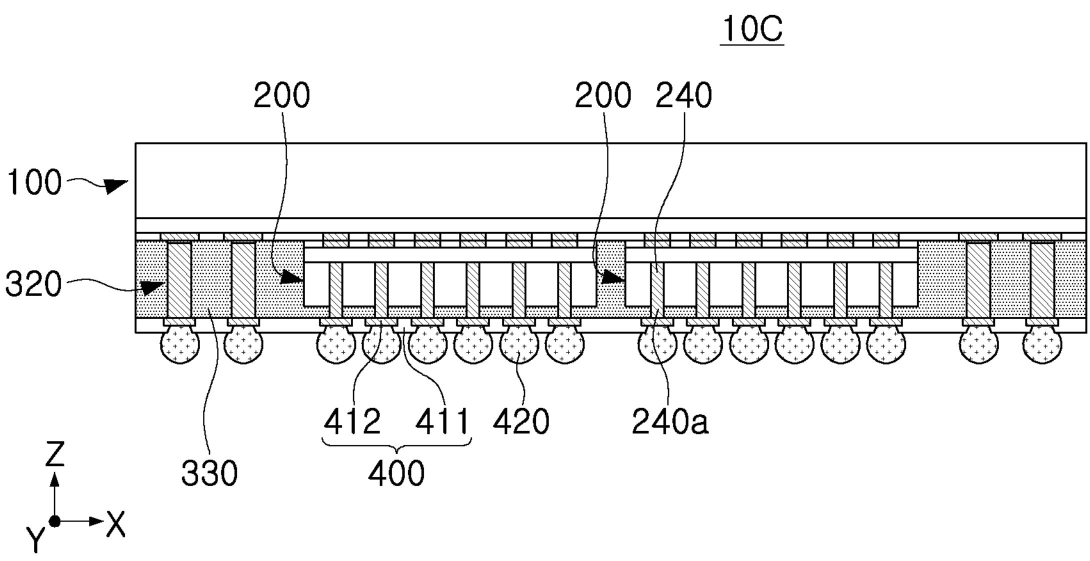
FIG. 3 is a cross-sectional view of a semiconductor package according to an embodiment.

FIG. 3 is a cross-sectional view of a semiconductor package according to an embodiment.

Referring to FIG. 3, a semiconductor package 10C according to an embodiment may include a plurality of second semiconductor chips 200 connected to the first semiconductor chip 100. In a plan view, the second semiconductor chips 200 may be positioned near the center of the first semiconductor chip 100, and through-vias 320 may be disposed to surround the second semiconductor chips 200. Since the second semiconductor chips 200 may have a structure substantially the same as or similar to that of the second semiconductor chip 200 illustrated in FIG. 1A, detailed descriptions of the same components may be omitted.

Figure 4:
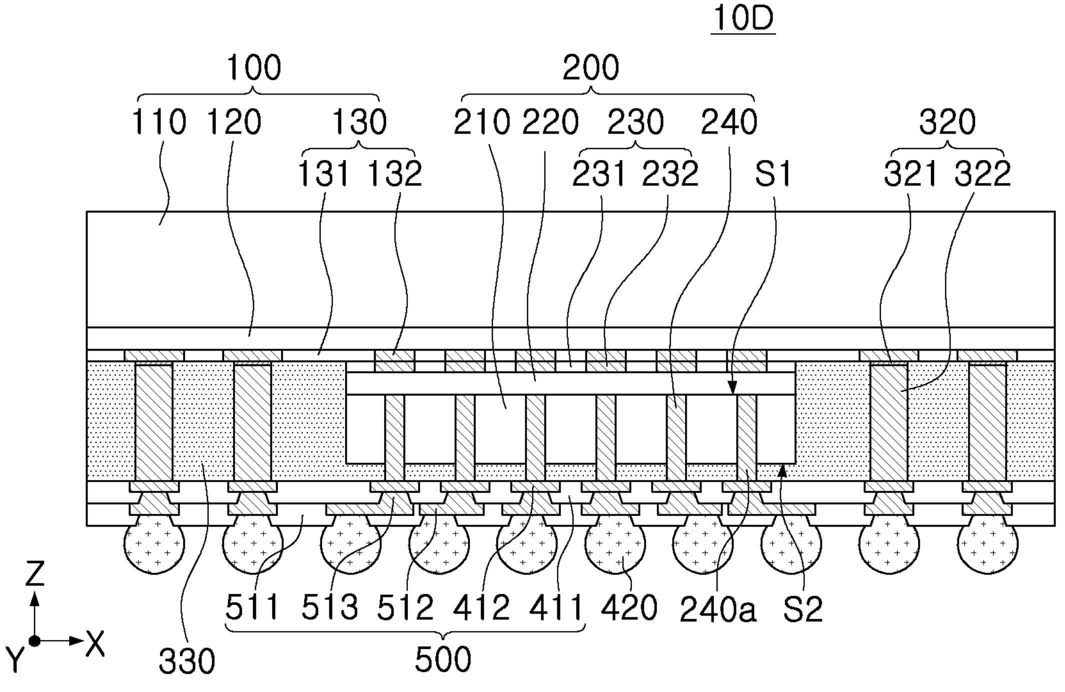
FIG. 4 is a cross-sectional view of a semiconductor package according to an embodiment.

FIG. 4 is a cross-sectional view of a semiconductor package according to an embodiment.

Referring to FIG. 4, a semiconductor package 10D according to an embodiment may include a redistribution layer 500 disposed below the encapsulant 330. In an embodiment, the redistribution layer 500 may include a plurality of layers. For example, the redistribution layer 500 may further include a protective layer 511, a wiring layer 512, and a via 513 compared to the redistribution layer 400 illustrated in FIG. 1A. The wiring layer 512 may be disposed below the wiring layer 412, and the via 513 may connect the wiring layer 412 and the wiring layer 512. The protective layer 511 may be disposed below the protective layer 411 and may partially cover the wiring layer 512. FIG. 4 illustrates that the redistribution layer 500 includes two layers, but embodiments are not limited thereto. In some embodiments, the redistribution layer 500 may include three or more layers. Furthermore, it should be appreciated that the electrical wiring connections of the redistribution layers shown throughout this disclosure are simplistic—the wiring of a redistribution layer may connect any two or more desired points between surfaces of the redistribution layer depending on the implemented design of the package.

Figure 5:
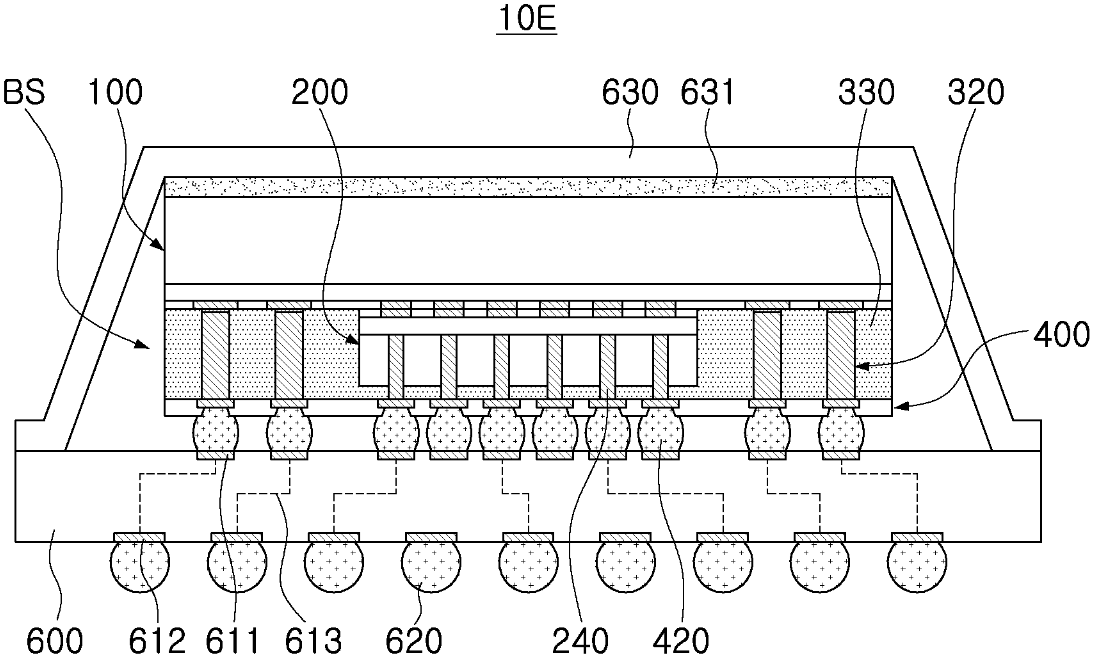
FIG. 5 is a cross-sectional view of a semiconductor package according to an embodiment.

FIG. 5 is a cross-sectional view of a semiconductor package according to an embodiment.

Referring to FIG. 5, a semiconductor package 10E according to an embodiment may include a bonding structure BS, a wiring substrate 600, and a heat dissipation structure 630. The bonding structure BS may include the first semiconductor chip 100, the second semiconductor chip 200, the encapsulant 330, and the like, and may have characteristics the same as or similar to those described above with reference to FIGS. 1A to 4.

The wiring substrate 600 may be a support board on which the bonding structure BS is mounted, and may be a substrate for a semiconductor package, such as a printed circuit board (PCB), a ceramic substrate, or a tape wiring substrate. The wiring substrate 600 may include a lower pad 612 disposed on a lower surface of the body, an upper pad 611 disposed on an upper surface of the body, and a wiring circuit 613 electrically connecting the lower pad 612 and the upper pad 611. The body of the wiring substrate 600 may include different materials depending on the type of substrate. For example, when the wiring substrate 600 is a printed circuit board, the wiring substrate 600 may be formed by additionally stacking a body copper-clad laminate or a wiring layer 412 on one side or both sides of the body copper-clad laminate. The upper pad 611, the lower pad 612, and the wiring circuit 613 may form an electrical path connecting the lower surface and the upper surface of the wiring substrate 600. An external connection bump 620 connected to the lower pad 612 may be disposed on the lower surface of the wiring substrate 600. The external connection bump 620 may include and/or be formed of tin (Sn), indium (In), bismuth (Bi), antimony (Sb), copper (Cu), silver (Ag), zinc (Zn), lead (Pb), and/or alloys thereof.

The heat dissipation structure 630 may be disposed on an upper surface of the wiring substrate 600 and cover the top of the bonding structure BS. The heat dissipation structure 630 may be attached on the wiring substrate 600 by an adhesive. As the adhesive, a thermally conductive adhesive tape, thermally conductive grease, or thermally conductive adhesive may be used. The heat dissipation structure 630 may be attached to an upper surface of the bonding structure BS by an adhesive member 631 on the bonding structure BS. The heat dissipation structure 630 may be formed of and/or include a conductive material having excellent thermal conductivity. For example, the heat dissipation structure 630 may be formed of and/or include a metal including gold (Au), silver (Ag), copper (Cu), iron (Fe), or metal alloy, or a conductive material, such as graphite or graphene. The heat dissipation structure 630 may have a shape different from that illustrated in the drawings. For example, the heat dissipation structure 630 may have a shape covering only the upper surface of the bonding structure BS.

FIGS. 6A to 6I are cross-sectional views illustrating an example of a method for manufacturing a semiconductor package according to a process sequence of an embodiment.

Figure 6A:
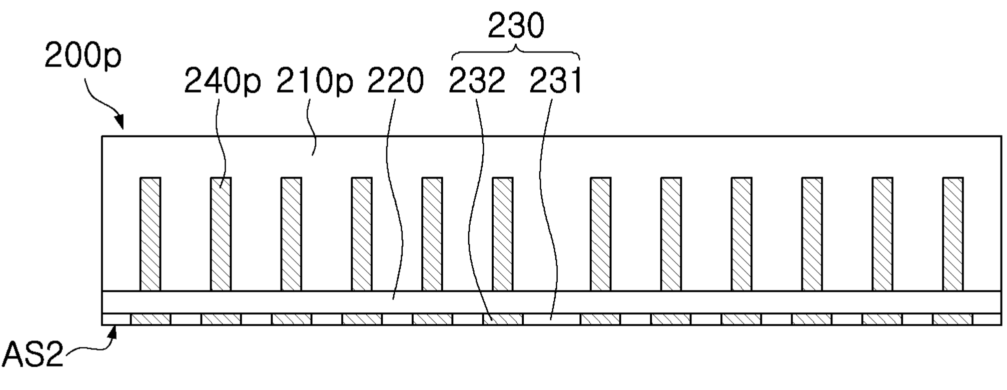
FIGS. 6A through 6I are cross-sectional views illustrating a sequential process of a method for manufacturing a semiconductor package according to an embodiment.

Referring to FIG. 6A, a second semiconductor structure 200*p* may be prepared as described hereafter.

A preliminary substrate 210*p*, a second circuit layer 220, a second bonding layer 230, and a preliminary through-electrode 240*p* may be formed in the second semiconductor structure 200*p*. First, a through-hole may be formed vertically in the preliminary substrate 210*p*, and the preliminary through-electrode 240*p* may be formed by filling the through-hole with a conductive material. The second circuit layer 220 may be formed on one surface of the preliminary substrate 210*p* to be electrically connected to the preliminary through-electrode 240*p*. The second bonding layer 230 may be formed on one surface of the preliminary substrate 210*p*, and may include a second pad 232 and a second insulating layer 231 covering a side surface of the second pad 232. The second pad 232 and the second insulating layer 231 may be formed to be coplanar. One surface of the second semiconductor structure 200*p* on which the second pad 232 is disposed may be referred to as a second active surface AS2. Thereafter, a grinding process may be performed on a surface opposite to the second active surface AS2 of the preliminary substrate 210*p*. A protective layer protecting the preliminary substrate 210*p* during the grinding process may be disposed on the second active surface AS2. After the grinding process, a thickness of the preliminary substrate 210*p* may be about 200 μm to about 300 μm.

Figure 6B:
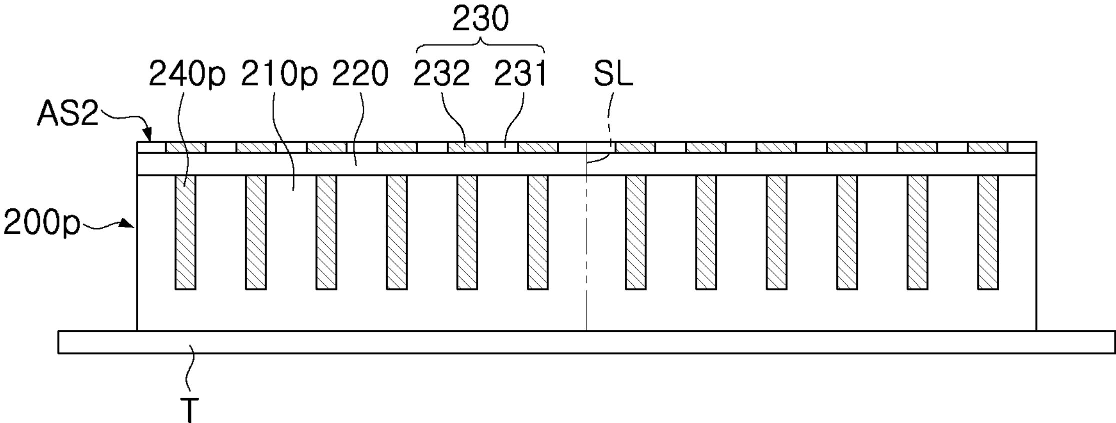

Referring to FIG. 6B, the second semiconductor structure 200*p* may be reversed and attached to a tape T such that the opposite surface of one surface of the preliminary substrate 210*p* faces downwardly. The second semiconductor structure 200*p* fixed on the tape T may be separated into second semiconductor chips 200 by a sawing process. For example, the second semiconductor structure 200*p* may be separated along a scribe line SL. The second semiconductor structure 200*p* formation process, the grinding process, and sawing process described above with reference to FIGS. 6A and 6B are examples, and may be performed differently in some embodiments. For example, as illustrated in FIGS. 2A and 2B, in an embodiment in which the chip connection terminal 235 is formed on the second active surface AS2 of the second semiconductor chip 200, the grinding process may be performed on the preliminary substrate 210*p* placed on the carrier substrate. After the grinding process, a thickness of the preliminary substrate 210*p* may be about 30 μm to about 40 μm.

Figure 6C:
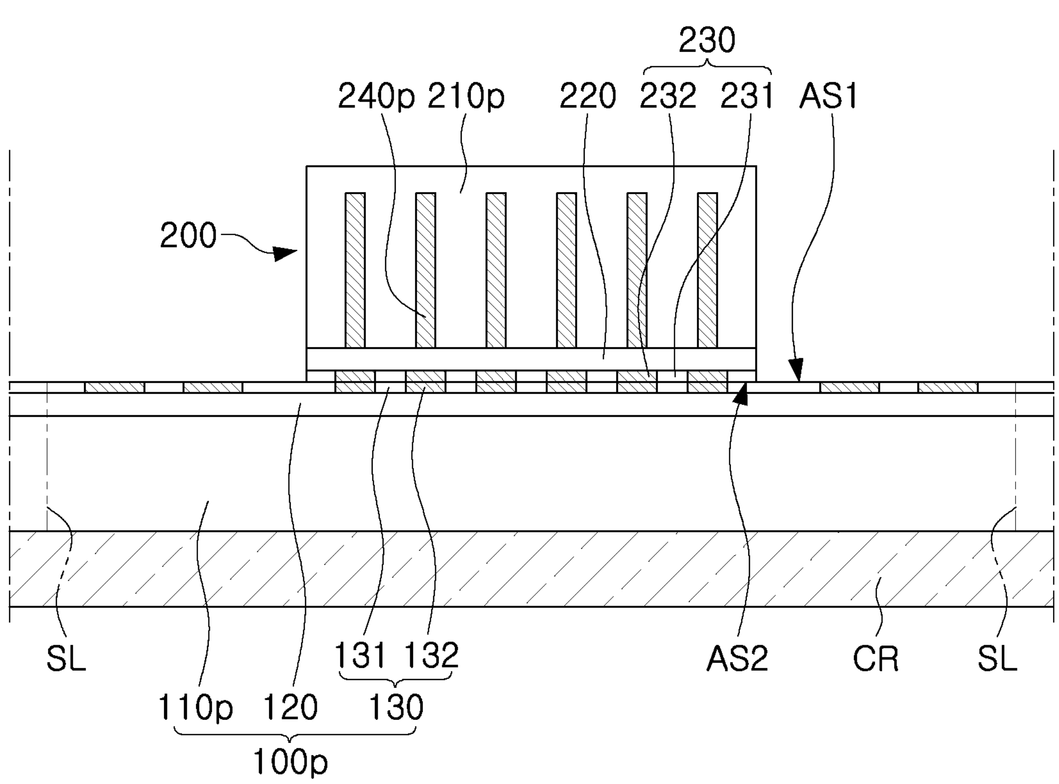

Referring to FIG. 6C, the separated second semiconductor chip 200 may be bonded to a first semiconductor structure 100*p* on a carrier substrate CR. The first semiconductor structure 100*p* may include a preliminary substrate 110*p*, a first circuit layer 120, and a first bonding layer 130. The preliminary substrate 110*p* may be formed of and/or include a semiconductor material. The first bonding layer 130 may include a first pad 132 and a first insulating layer 131 covering a side surface of the first pad 132. The first pad 132 and the first insulating layer 131 may be disposed to be coplanar.

In an embodiment, a bonding process may be performed so that the second active surface AS2 of the second semiconductor chip 200 contacts the first active surface AS1 of the first semiconductor structure 100*p* in a facing manner. The bonding process may be a hybrid bonding method. The second pads 232 may be disposed to correspond to the first pads 132, and each second pad 232 may be bonded to the corresponding first pad 132. For example, each second pad 232 may be aligned to overlap the first pad 132 in a vertical direction and bonded to the corresponding first pad 132. The second insulating layer 231 may be bonded to the first insulating layer 131. The bonding process may be performed in a thermal atmosphere ranging from about 100° C. to about 300° C. However, the temperature of the heat atmosphere is not limited to the above range and may be variously changed. As illustrated in FIG. 6C, since the first active surface AS1 and the second active surface AS2 adjacent to the first circuit layer 120 and the second circuit layer 220 are bonded to each other, current consumption of the device may be reduced and electrical properties may be improved.

Figure 6D:
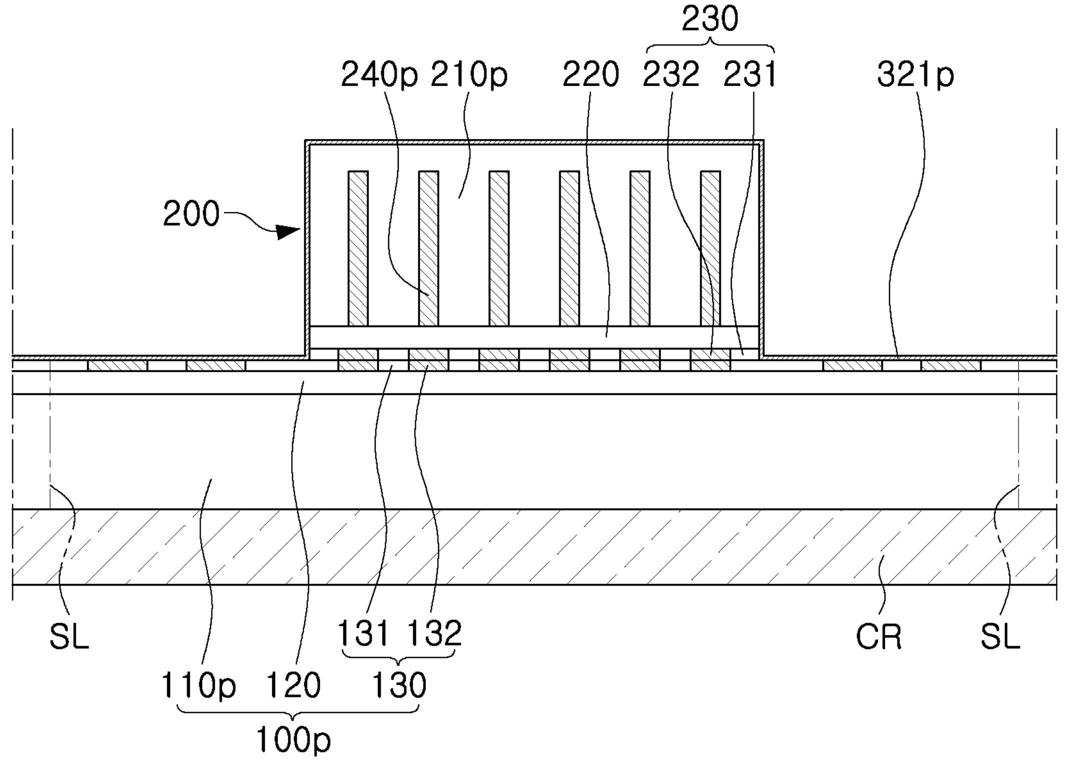

Referring to FIG. 6D, a preliminary seed layer 321*p* may be formed on a resultant structure of FIG. 6C. The preliminary seed layer 321*p* may be formed on the first active surface AS1 of the first semiconductor structure 100*p* and the exposed surface of the second semiconductor chip 200. Since the preliminary through-electrode 240*p* of the second semiconductor chip 200 is buried in the preliminary substrate 210*p*, the preliminary through-electrode 240*p* may not be contaminated during a preliminary seed layer 321*p* process. The preliminary seed layer 321*p* may be formed using a plating process, a PVD process, or a CVD process.

Figure 6E:
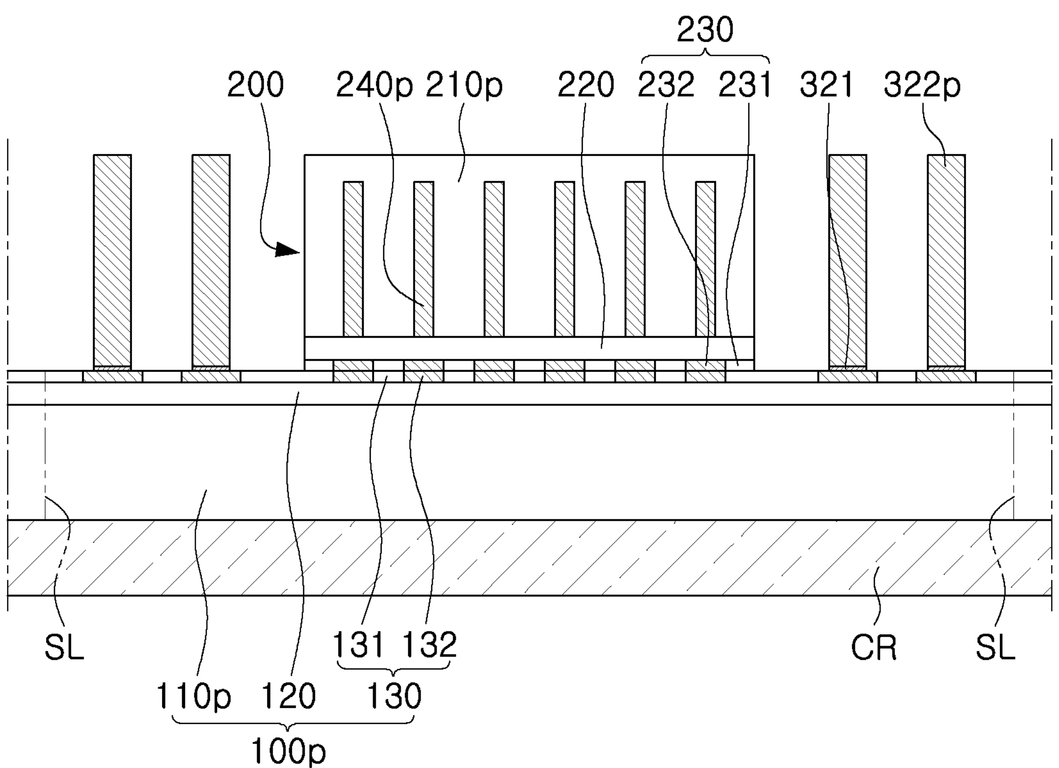

Referring to FIG. 6E, a preliminary plating layer 322*p* may be formed on the first pad 132. The preliminary plating layer 322*p* may be formed by forming a photoresist to cover the preliminary seed layer 321*p*, forming an opening in the photoresist to expose a portion of the seed layer corresponding to the first pad 132, and filling the opening with a conductive material. The preliminary plating layer 322*p* may be formed by an electroplating method using the preliminary seed layer 321*p*. The preliminary plating layer 322*p* may be formed at the same height as or higher than the preliminary through-electrode 240*p*.

After the preliminary plating layer 322*p* is formed, the photoresist may be removed. A portion of the preliminary seed layer 321*p* covering the first active surface AS1 of the first semiconductor structure and the surface of the second semiconductor chip 200 may be removed with the exception of a portion of the preliminary seed layer 321*p* covered by the preliminary plating layer 322*p* (which is not removed but remains), which may be referred to as the seed layer 321.

Figure 6F:
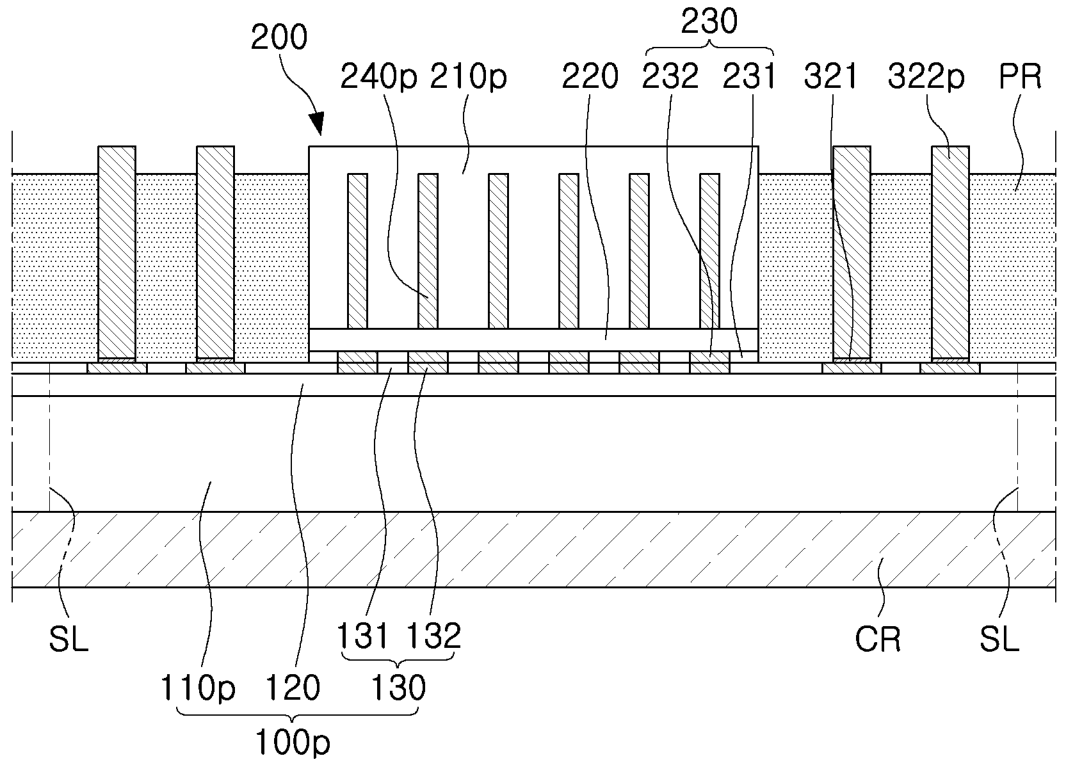

Referring to FIG. 6F, a photoresist PR may be formed to cover a portion of the first semiconductor structure 100*p*, the preliminary plating layer 322*p*, and the second semiconductor chip 200. The photoresist PR may be formed by applying a photosensitive material and curing the photosensitive material through a baking process. An upper portion of the photoresist PR may be removed to expose an upper surface of the second semiconductor chip 200. A process of removing an upper portion of the photoresist PR may be performed by an exposure process or an ashing process.

Figure 6G:
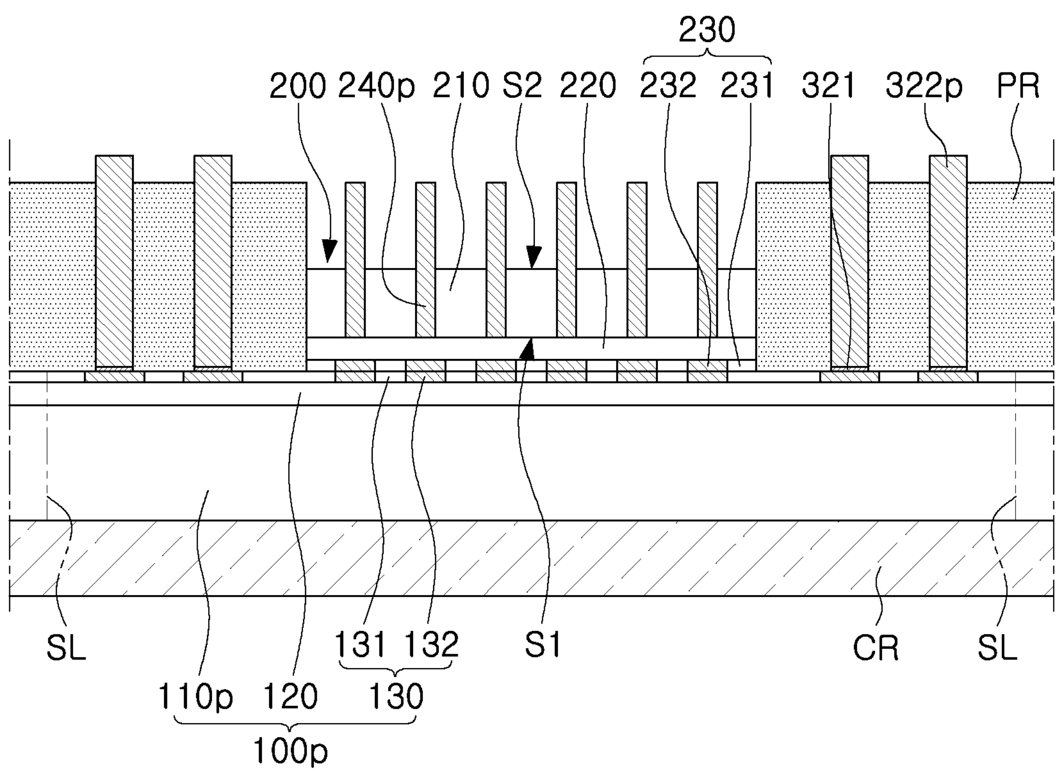

Referring to FIG. 6G, the second substrate 210 may be formed by etching the preliminary substrate 210*p* of the second semiconductor chip 200 to expose the preliminary through-electrode 240*p*. A surface of the second substrate 210 contacting the second circuit layer 220 may be referred to as a front surface S1, and a surface opposite to the front surface S1 may be referred to as a rear surface S2. The preliminary substrate 210*p* may be etched so that the rear surface S2 of the second substrate 210 is formed at a level lower (as viewed in the orientation of FIG. 6) than that of the upper surface (as viewed in the orientation of FIG. 6) of the preliminary through-electrode 240*p*. The second substrate 210 may not be completely removed. Removal of portions of the preliminary substrate 210*p* may expose an upper portion of the preliminary through-electrode 240*p*. The etching process may be an etch-back process.

As illustrated in FIGS. 6C and 6G, only after the second semiconductor chip 200 is bonded to the first semiconductor structure 100*p*, the preliminary substrate 210*p* may be etched. Therefore, due to the relatively larger size of the preliminary substrate 210*p* (as compared to the reduced size of the second semiconductor chip 200), defects, such as cracks, may be prevented from occurring in the second semiconductor chip 200 during the bonding process. Also, since the preliminary substrate 210*p* is etched after the bonding process, a thickness of the semiconductor package 10A may be reduced.

Figure 6H:
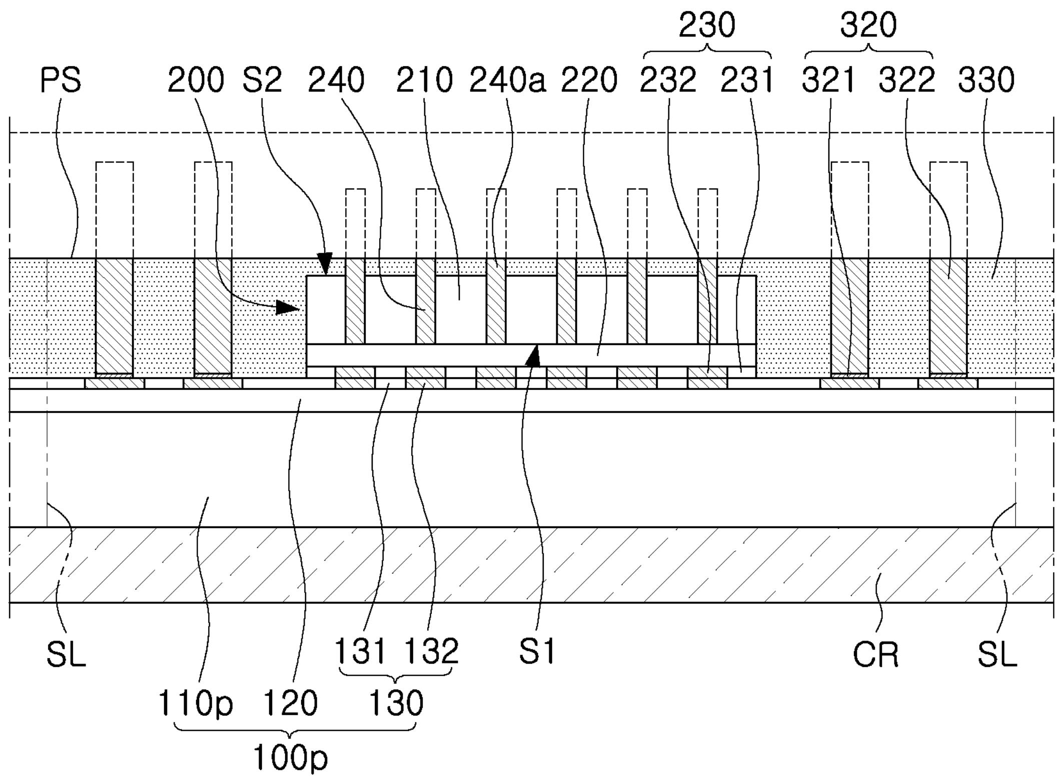

Referring to FIG. 6H, the photoresist PR may be removed by a strip process. The encapsulant 330 may be formed to cover the first semiconductor structure 100*p*, the preliminary plating layer 322*p*, and the second semiconductor chip 200. In an embodiment, the encapsulant 330 may be formed of and/or include a thermosetting and/or photocurable polymeric material having good gap-filling capability.

After the encapsulant 330 is formed, a planarization process for planarizing the encapsulant 330 may be performed to expose the preliminary through-electrode 240*p*, thereby forming a flat surface. Through the planarization process, the upper portion of the preliminary through-electrode 240*p* may be partially removed to form the through-electrode 240, and an upper portion of the preliminary plating layer 322*p* may be partially removed to form the plating layer 322. The seed layer 321 and the plating layer 322 may constitute the through-via 320. A portion of the through-electrode 240 not covered by the second substrate 210 and protruding from the rear surface S2 of the second substrate 210 may be referred to as a protrusion 240*a*. The flat surface PS of the encapsulant 330 may be coplanar with the through-electrode 240 and the plating layer 322. For example, the protrusion 240*a* may be coplanar with the flat surface PS of the encapsulant 330. In addition, the encapsulant 330 may fill a space between the plurality of protrusions 240*a* and may contact a side surface of the protrusion 240*a*, a side surface of the second substrate 210, and the rear surface S2. As described above, the second semiconductor chip 200 of the present disclosure may be implemented with a relatively smaller thickness by etching the preliminary substrate 210*p* after the bonding process. Accordingly, the length of the through-electrode 240 may be shortened, thereby reducing current consumption of the semiconductor package and improving electrical characteristics.

Figure 6I:
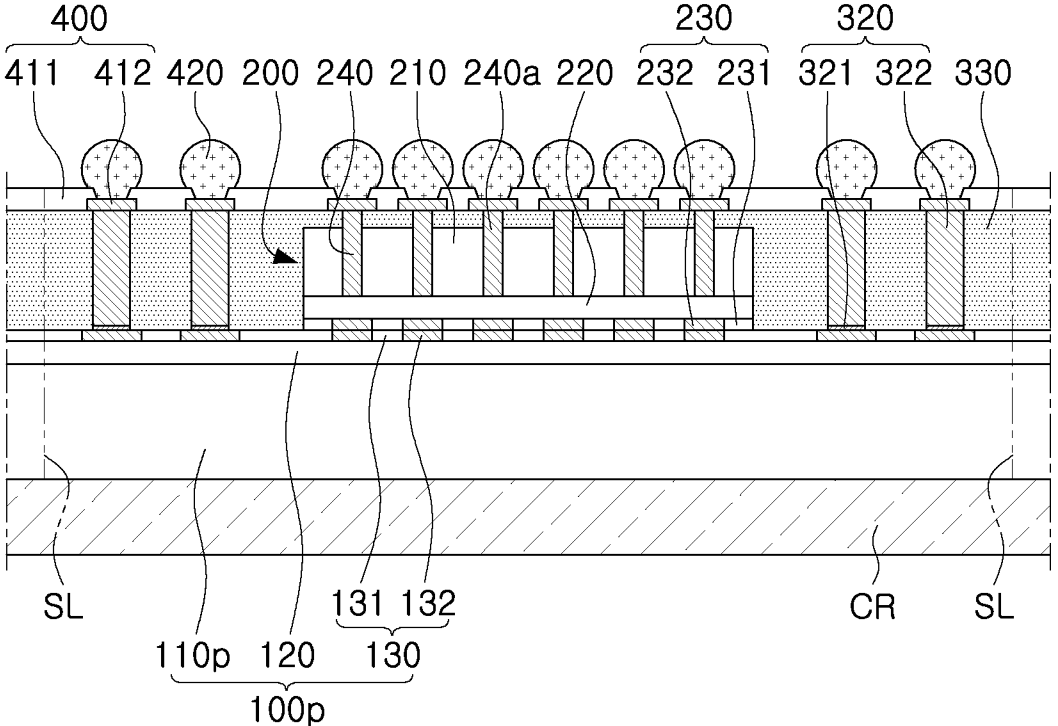

Referring to FIG. 6I, a redistribution layer 400 may be formed on the flat surface PS. The redistribution layer 400 may include a protective layer 411 and a wiring layer 412. The wiring layer 412 may be formed by forming a conductive material on the flat surface PS using a plating process, a PVD process, or a CVD process, and then patterning the conductive material. The wiring layer 412 may be a structure including wirings for redistribution and pads connected to the wirings. The protective layer 411 may be formed by forming an insulating material to cover the flat surface PS and the wiring layer 412 and patterning the insulating material to expose the wiring layer 412. After the redistribution layer 400 is formed, an external connection terminal 420 may be formed on the wiring layer 412.

Referring back to FIG. 1A, thereafter, the first semiconductor structure 100*p* may be cut along the scribe line SL to form the first substrate 110 and the first semiconductor chip 100, and the semiconductor package 10A may be formed.

According to embodiments of the inventive concept, since the substrate etching process is performed after the bonding process of the semiconductor chips is performed, the thickness of the semiconductor package may be reduced and electrical characteristics may be improved.

While embodiments have been illustrated and described above, it will be apparent to those skilled in the art that modifications and variations could be made without departing from the scope of the present inventive concept as defined by the appended claims.

What is claimed is:

1. A semiconductor package comprising:

a first semiconductor chip including a first bonding layer, the first bonding layer including a first chip pad and a first insulating layer covering a side surface of the first chip pad;

a second semiconductor chip disposed below the first semiconductor chip and including a substrate having front and rear surfaces, a second bonding layer disposed on the front surface, and through-electrodes passing through the substrate and protruding from the rear surface to form protrusions, the second bonding layer including a second chip pad contacting the first chip pad and a second insulating layer covering a side surface of the second chip pad;

a redistribution layer disposed below the second semiconductor chip and electrically connected to the second semiconductor chip;

vias disposed between the redistribution layer and the first semiconductor chip and disposed around the second semiconductor chip; and an encapsulant surrounding the second semiconductor chip and the vias and covering an upper surface of the redistribution layer, wherein the encapsulant is in contact with the protrusions of the through-electrodes and the rear surface of the substrate.

2. The semiconductor package of claim 1, wherein the encapsulant fills a space between the protrusions.

3. The semiconductor package of claim 1, wherein the encapsulant is in contact with the first bonding layer and a side surface of the second semiconductor chip.

4. The semiconductor package of claim 1, wherein the first insulating layer is in contact with the second insulating layer.

5. The semiconductor package of claim 1, wherein the encapsulant is in contact with the rear surface of the substrate of the second semiconductor chip.

6. The semiconductor package of claim 1, wherein a horizontal width of the first semiconductor chip is greater than a horizontal width of the second semiconductor chip.

7. The semiconductor package of claim 1, wherein a center of the second semiconductor chip is aligned with a center of the first semiconductor chip, and the vias are arranged to surround the second semiconductor chip.

8. The semiconductor package of claim 1, wherein the first semiconductor chip further includes a first circuit layer disposed on the first bonding layer, and the second semiconductor chip further includes a second circuit layer disposed below the second bonding layer and electrically connected to the first circuit layer.

9. The semiconductor package of claim 1, wherein a thickness of the substrate is about 10 μm to about 40 μm.

10. The semiconductor package of claim 1, wherein a width of each of the through-electrodes is smaller than a width of the via.

11. The semiconductor package of claim 1, wherein a width of each of the through-electrodes is about 1 μm to about 5 μm.

12. The semiconductor package of claim 1, wherein lower surfaces of the through-electrodes and lower surfaces of the vias are coplanar with a lower surface of the encapsulant.

13. The semiconductor package of claim 1, wherein the redistribution layer includes a first wiring layer, a second wiring layer below the first wiring layer, and a via connecting the first wiring layer to the second wiring layer.

14. The semiconductor package of claim 1, wherein the encapsulant includes at least one of a thermosetting or photocurable polymer material.

15. A semiconductor package comprising:

a first semiconductor chip including a first active surface;

a second semiconductor chip including a second active surface in contact with the first active surface, the second semiconductor chip including a substrate including front and rear surfaces and through-electrodes passing through the substrate and protruding from the rear surface of the substrate to form protrusions;

a redistribution layer disposed below the second semiconductor chip and electrically connected to the second semiconductor chip;

vias disposed between the redistribution layer and the first semiconductor chip and disposed around the second semiconductor chip; and an encapsulant surrounding the second semiconductor chip and the vias and covering an upper surface of the redistribution layer, wherein the encapsulant is in contact with the protrusions of the through-electrodes and the rear surface of the substrate.

16. The semiconductor package of claim 15, wherein an upper surface of each of the vias is in contact with the first active surface.

17. The semiconductor package of claim 15, wherein the encapsulant is in contact with the first active surface.

18. A semiconductor package comprising:

a first semiconductor chip including a first bonding layer;

a second semiconductor chip disposed below the first semiconductor chip and including a substrate having front and rear surfaces, a second bonding layer disposed on the front surface, and through-electrodes passing through the substrate and protruding from the rear surface to form protrusions;

chip connection terminals disposed on the first semiconductor chip and connecting the first semiconductor chip to the second semiconductor chip;

a redistribution layer disposed below the second semiconductor chip and electrically connected to the second semiconductor chip;

vias disposed between the redistribution layer and the first semiconductor chip and disposed around the second semiconductor chip; and an encapsulant surrounding the second semiconductor chip and the vias and covering an upper surface of the redistribution layer, wherein the encapsulant is in contact with the protrusions of the through-electrodes and the rear surface of the substrate.

19. The semiconductor package of claim 18, wherein the encapsulant fills a space between the chip connection terminals and is in contact with the first bonding layer and the second bonding layer.

20. The semiconductor package of claim 18, further comprising an adhesive layer disposed between the first bonding layer and the second bonding layer and covering the chip connection terminals.

* * * * *